US012768888B2

(12) United States Patent
Dove et al.

(10) Patent No.: US 12,768,888 B2
(45) Date of Patent: Oct. 20, 2026

(54) TEST ABSTRACTION DATA MODEL

(71) Applicant: NATIONAL INSTRUMENTS CORPORATION, Austin, TX (US)

(72) Inventors: Andrew Philip Dove, Austin, TX (US); Jan Viborg Moeller, Greve (DK); Ritesh K. Soni, Austin, TX (US); Joseph E. Peck, Hutto, TX (US)

(73) Assignee: NATIONAL INSTRUMENTS CORPORATION, Austin, TX (US)

( * ) Notice: Subject to any disclaimer, the term of this patent is extended or adjusted under 35 U.S.C. 154(b) by 894 days.

(21) Appl. No.: 18/172,754

(22) Filed: Feb. 22, 2023

(65) Prior Publication Data

US 2023/0266390 A1 Aug. 24, 2023

Related U.S. Application Data

(60) Provisional application No. 63/313,121, filed on Feb. 23, 2022.

(51) Int. Cl.
*G01R 31/3183* (2006.01)
*G01R 31/317* (2006.01)

(52) U.S. Cl.
CPC ................ *G01R 31/318314* (2013.01); *G01R 31/31713* (2013.01); *G01R 31/318371* (2013.01)

(58) Field of Classification Search
CPC ...... G01R 31/318314; G01R 31/31713; G01R 31/318371; G06F 11/2273
See application file for complete search history.

(56) References Cited

U.S. PATENT DOCUMENTS

| | | | | |
|---|---|---|---|---|
| 5,910,895 | A * | 6/1999 | Proskauer | G01R 31/31912 700/121 |
| 8,928,346 | B2 | 1/2015 | Tenucci et al. | |
| 9,885,745 | B2 | 2/2018 | Hamilton | |
| 9,959,186 | B2 | 5/2018 | Hutner et al. | |
| 2022/0108262 | A1* | 4/2022 | Cella | G05B 17/02 |
| 2022/0148065 | A1* | 5/2022 | O'Brien | G06Q 30/0631 |
| 2023/0152374 | A1* | 5/2023 | Sauer | G01R 13/0254 714/724 |

* cited by examiner

*Primary Examiner* — Yossef Korang-Beheshti
(74) *Attorney, Agent, or Firm* — Kowert, Hood, Munyon, Rankin & Goetzel, P.C.; Jeffrey C. Hood; Luke Langsjoen

(57) ABSTRACT

Methods and computing devices for matching an instrument to a device-under-test for performing a test procedure. A first data structure is constructed based on a data sheet of an instrument. The first data structure includes attributes, phenomena to be measured and testing interactions for measuring respective phenomena. A test case is constructed based on a test procedure to be performed on the DUT. The test case includes attributes, phenomena to be measured and testing interactions for measuring respective phenomena. The attributes, phenomena, and testing interactions of the first data structure and the test case are compared to determine a matching condition, and instructions are output based on the matching condition.

15 Claims, 12 Drawing Sheets

*analog input characteristics*

| | |
|---|---|
| number of channels | 16 differential/32 single-ended channels |
| ADC resolution | 16 bits |
| DNL | no missing codes quaranteed |
| conversion time (maximum sampling rate) | |
| compactRIO & compactDAQ chassis | 4.00 μs (250 kS/s) |
| R series expansion chassis | 4.50 μs (222 kS/s) |
| input coupling | DC |
| nominal input ranges | ±10 V, ±5 V, ±1 V, ±0.2 V |
| minimum overrange, ±10 V range | 4% |
| maximum working voltage for analog inputs (signal + common mode) | each channel must remain within ±10.4 V of COM |
| input impedence (AI-to-COM) | |
| powered on | >10 GΩ min parallel with 100 pF |
| powered off/overload | 4.7 kΩ minimum |
| input bias current | ±100 pA |

FIG. 5

TEST ABSTRACTION DATA MODEL

PRIORITY CLAIMS

This application claims priority to U.S. Provisional Patent Application No. 63/313,121, titled "Test Abstraction Data Model" and filed Feb. 23, 2022, which is hereby incorporated by reference in its entirety as though fully and completely set forth herein.

TECHNICAL FIELD

The present disclosure is related to measurements on a device-under-test (DUT) and more particularly to matching a testing procedure for a DUT to an instrument.

DESCRIPTION OF THE RELATED ART

To ensure reliable performance of a product, quality control has become a major part of manufacturing. Therefore, each unit manufactured is tested under a number of conditions to ensure quality. Each test may require a number of instruments to perform a number of measurements and based on the outcome of these measurements, a decision is made to mark the unit as pass or fail. Hence, manufacturing testing plays an important role in ensuring quality products in the marketplace. Manufacturing testing may occur for a plurality of different concurrent measurements, and each measurement may be configured with different measurement configurations.

A user that wishes to perform signal measurements may use hardware and software measurement systems to control certain aspects of the signal measurements. A manufacturing facility may generally have a large number of different types of DUTs, testing procedures, and instruments configured to interface with a DUT, and matching an appropriate instrument to a DUT for effectively performing a particular testing procedure may be difficult. Accordingly, improvements in the field are desirable.

SUMMARY

Embodiments described herein relate to systems, memory media, and methods for matching an instrument to a device-under-test (DUT) for performing a test procedure.

In some embodiments, a first data structure is constructed based on a data sheet of an instrument. The tester device may be any of a variety of types of instruments configured to interface with the DUT. The first data structure includes attributes, phenomena to be measured and testing interactions for measuring respective phenomena.

In some embodiments, a test case is constructed based on a test procedure to be performed on the DUT. The test case includes attributes, phenomena to be measured and testing interactions for measuring respective phenomena.

In some embodiments, the attributes, phenomena, and testing interactions of the first data structure and the test case are compared to determine a matching condition. The attributes may be compared first, followed by the phenomena, followed by the testing interactions. The matching condition may indicate a partial match, a full match, or a mismatch.

In some embodiments, instructions are output based on the matching condition.

Note that the techniques described herein may be implemented in and/or used with a number of different types of DUTs, including but not limited to base stations, access points, cellular phones, portable media players, tablet computers, wearable devices, RF semiconductor components, RF power amplifiers, Front End Modules, transceivers, and various other computing devices.

This Summary is intended to provide a brief overview of some of the subject matter described in this document. Accordingly, it will be appreciated that the above-described features are only examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

A better understanding of the disclosed embodiments can be obtained when the following detailed description of the preferred embodiments is considered in conjunction with the following drawings.

FIG. 5 illustrates an example data sheet of a DUT, according to some embodiments;

Figure 1A:
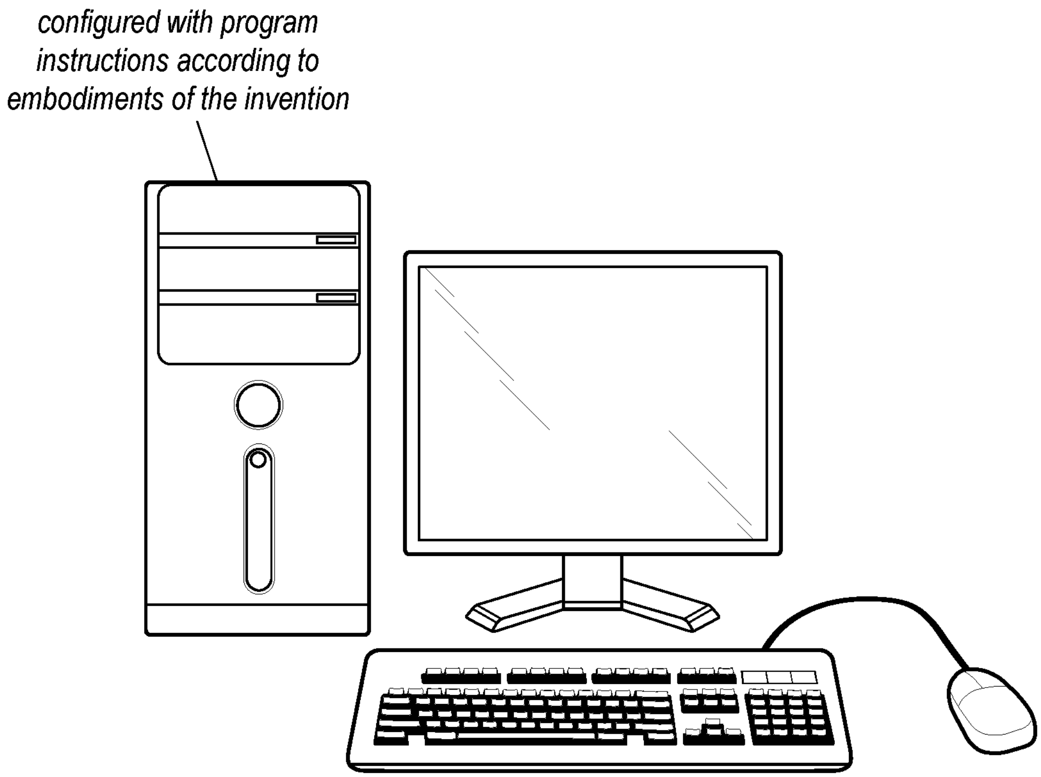
FIG. 1A illustrates a computer system, according to some embodiments.

This specification includes references to various embodiments, to indicate that the present disclosure is not intended to refer to one particular implementation, but rather a range of embodiments that fall within the spirit of the present disclosure, including the appended claims. Particular features, structures, or characteristics may be combined in any suitable manner consistent with this disclosure.

Terminology

The following is a glossary of terms used in the present document.

Device Under Test (DUT) or Unit Under Test (UUT)—A physical device or component that is being tested.

Memory Medium—Any of various types of memory devices or storage devices. The term "memory medium" is intended to include an installation medium, e.g., a CD-ROM, floppy disks 104, or tape device; a computer system memory or random access memory such as DRAM, DDR RAM, SRAM, EDO RAM, Rambus RAM, etc.; or a non-volatile memory such as a magnetic media, e.g., a hard drive, or optical storage. The memory medium may comprise other types of memory as well, or combinations thereof. In addition, the memory medium may be located in a first computer in which the programs are executed, or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as signals such as electrical, electromagnetic, or digital signals, conveyed via a communication medium such as a bus, network and/or a wireless link.

Multiprocessor System—a computer system that includes multiple processing elements, i.e., processors, processing cores, or even networked computers, that may operate in a coordinated manner to execute program instructions concurrently.

Concurrently—a manner of performing actions or processes such that at least a portion of the (concurrent) processes overlap in time, e.g., at least one of the processes executes at least one iteration while another process executes an iteration. Concurrence, as used herein, may be accomplished in any of multiple ways, including through the use of single processor systems, e.g., via multi-threading, time-slices, etc., or multiprocessor (or multicore) systems, as well as any other technique for processing functions at the same time.

Function—a discrete set of one or more steps that form at least a part of a process.

Acquisition—refers to the acquiring of analog signals and converting the analog signals to digital data, e.g., bits.

Measurement Data Sets—the digital data resulting from an acquisition, including the "raw" digital bits and/or the digital bits converted via some scaling to any of a variety of formats, including voltages and other engineering units.

Programmable Hardware Element—includes various types of programmable hardware, reconfigurable hardware, programmable logic, or field-programmable devices (FPDs), such as one or more FPGAs (Field Programmable Gate Arrays), or one or more PLDs (Programmable Logic Devices), such as one or more Simple PLDs (SPLDs) or one or more Complex PLDs (CPLDs), or other types of programmable hardware. A programmable hardware element may also be referred to as "reconfigurable logic".

Medium—includes one or more of a memory medium, carrier medium, and/or programmable hardware element; encompasses various types of mediums that can either store program instructions/data structures or can be configured with a hardware configuration program.

Program—the term "program" is intended to have the full breadth of its ordinary meaning. The term "program" includes 1) a software program which may be stored in a memory and is executable by a processor or 2) a hardware configuration program useable for configuring a programmable hardware element.

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, such as C, C++, Pascal, Fortran, Cobol, Java, assembly language, etc.; graphical programs (programs written in graphical programming languages); assembly language programs; programs that have been compiled to machine language; scripts; and other types of executable software. A software program may comprise two or more software programs that interoperate in some manner.

Hardware Configuration Program—a program, e.g., a netlist or bit file, that can be used to program or configure a programmable hardware element.

Graphical Program—A program comprising a plurality of interconnected nodes or icons, wherein the plurality of interconnected nodes or icons visually indicate functionality of the program.

Data Flow Graphical Program (or Data Flow Diagram)—A graphical program or diagram comprising a plurality of interconnected nodes, wherein the connections between the nodes indicate that data produced by one node is used by another node.

Graphical User Interface—this term is intended to have the full breadth of its ordinary meaning. The term "graphical user interface" is often abbreviated to "GUI". A GUI may comprise only one or more input GUI elements, only one or more output GUI elements, or both input and output GUI elements.

The following provides examples of various aspects of GUIs. The following examples and discussion are not intended to limit the ordinary meaning of GUI, but rather provide examples of what the term "graphical user interface" encompasses:

A GUI may comprise a single window, panel, or dialog box having one or more GUI Elements, or may comprise a plurality of individual GUI Elements (or individual windows each having one or more GUI Elements), wherein the individual GUI Elements or windows may optionally be tiled together.

Graphical User Interface Element—an element of a graphical user interface, such as for providing input or displaying output. Exemplary graphical user interface elements include input controls and output indicators.

Input Control—a graphical user interface element for providing user input to a program. Exemplary input controls include buttons, check boxes, input text boxes, knobs, sliders, etc.

Output Indicator—a graphical user interface element for displaying output from a program. Exemplary output indicators include charts, graphs, gauges, output text boxes, numeric displays, etc. An output indicator is sometimes referred to as an "output control".

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Measurement Device (or Tester Device or Instrument)—includes instruments, data acquisition devices, smart sensors, and any of various types of devices that are operable to acquire and/or store data from a DUT. A measurement device/tester device/instrument may also optionally be further operable to analyze or process the acquired or stored data. Examples of a measurement/tester device include an instrument, such as a traditional stand-alone "box" instrument, a computer-based instrument (instrument on a card) or external instrument, a data acquisition card, a device external to a computer that operates similarly to a data acquisition card, a smart sensor, one or more DAQ or measurement cards or modules in a chassis, an image acquisition device, such as an image acquisition (or machine vision) card (also called a video capture board) or smart camera, a motion control device, a robot having machine vision, and other similar types of devices. Exemplary "stand-alone" instruments include oscilloscopes, multimeters, signal analyzers, arbitrary waveform generators, spectroscopes, and similar measurement, test, or automation instruments.

A measurement/tester device may be further operable to perform control functions, e.g., in response to analysis of the acquired or stored data. For example, the measurement/tester device may send a control signal to an external system, such as a motion control system or to a sensor, in response to particular data. A measurement/tester device may also be operable to perform automation functions, i.e., may receive and analyze data, and issue automation control signals in response.

User Equipment (UE) (or "UE Device")—any of various types of computer systems devices which are mobile or portable and which performs wireless communications, such as mobile wireless devices. Examples of UE devices include mobile telephones (e.g., cellular telephones ("cell phones")) or smart phones (e.g., iPhone™ Android™-based phones), portable gaming devices (e.g., Nintendo DS™, PlayStation Portable™, Gameboy Advance™, iPod™), laptops, tablets (e.g., iPad™, Android™-based tablets), PDAs, portable Internet devices, music players, data storage devices, or other handheld devices, etc. In general, the term "UE" or "UE device" can be broadly defined to encompass any electronic, computing, and/or telecommunications device (or combination of devices) which is easily transported by a user and capable of wireless communication.

Phenomenon—any of a variety of physical quantities that may be measured or tested for a DUT by a measurement device, testing device, or another instrument.

Testing Interaction—any action or procedure that occurs between a DUT and an instrument to measure a particular phenomenon.

Interaction Set—a single phenomenon associated with one or more testing interactions.

Testing Procedure—a sequence of actions to be performed on a DUT to test one or more capabilities of the DUT. The sequence of actions may or may not be performed in a particular order.

Test Methodology—a data structure constructed based on one or more testing procedures that includes phenomena names and testing interaction names but does not include phenomena values and testing interaction values.

Test Case—a data structure that quantifies characteristics of a specific testing procedure to be performed on a particular DUT. The test case includes phenomena names, testing interaction names, phenomena values and testing interaction values.

DETAILED DESCRIPTION

FIG. 1A: Computer System

FIG. 1A illustrates a computer system 82 configured to implement various embodiments. More specifically, the computer system 82 may be configured to execute one or more programs, e.g., one or more graphical data flow programs, to execute a measurement function (for example, in some embodiments, to test one or more devices under test (DUTs)), where the measurement function may include an acquisition sequence and a processing sequence.

As shown in FIG. 1A, the computer system 82 may include a display device. In some embodiments, the computer system 82 may be configured to display a (possibly graphical) program as the program is created and/or executed. The display device may also be configured to display a graphical user interface or soft front panel of the program during execution of the program. The graphical user interface may comprise any type of graphical user interface, e.g., depending on the computing platform.

The computer system 82 may include at least one memory medium on which one or more computer programs or software components according to one embodiment may be stored. The memory may be coupled to one or more processors and store program instructions executable by the one or more processors. For example, the memory medium may store one or more programs, e.g., graphical programs, which are executable to perform embodiments of the methods described herein. Additionally, the memory medium may store a programming development environment application used to create and/or execute such programs. The memory medium may also store operating system software, as well as other software for operation of the computer system. Various embodiments further include receiving or storing instructions and/or data implemented in accordance with the foregoing description upon a carrier medium.

Figure 1B:
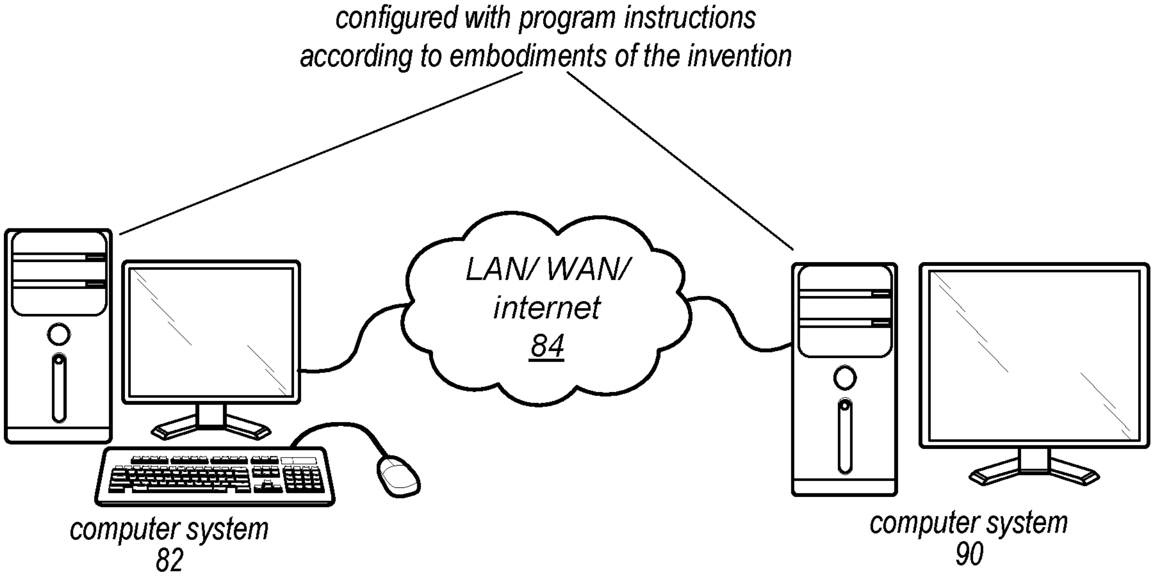
FIG. 1B illustrates a network system, according to some embodiments.

FIG. 1B: Computer Network

FIG. 1B illustrates a system including a first computer system 82 that is coupled to a second computer system 90. The computer system 82 may be coupled via a network 84 (or a computer bus) to the second computer system 90. The computer systems 82 and 90 may each be any of various types, as desired. The network 84 can also be any of various types, including a LAN (local area network), WAN (wide area network), the Internet, or an Intranet, among others. The computer systems 82 and 90 may execute programs, e.g., one or more graphical programs, in a distributed fashion. For example, computer 82 may execute a first portion of the block diagram of a graphical program and computer system 90 may execute a second portion of the block diagram of the graphical program. As another example, computer 82 may display the graphical user interface of a graphical program and computer system 90 may execute the block diagram of the graphical program.

In one embodiment, the graphical user interface of the program and a soft front panel may be displayed on a display device of the computer system 82, and the block diagram may execute on a device coupled to the computer system 82. The device may include a programmable hardware element and/or may include a processor and memory medium which may execute a real time operating system. In one embodiment, the program may be downloaded and executed on the device. For example, an application development environment with which the program is associated may provide support for downloading a program for execution on the device in a real time system. It should be noted that while various embodiments are described herein in terms of a graphical program implementation, any other types of programs or programming technologies may be used as desired.

Figure 2:
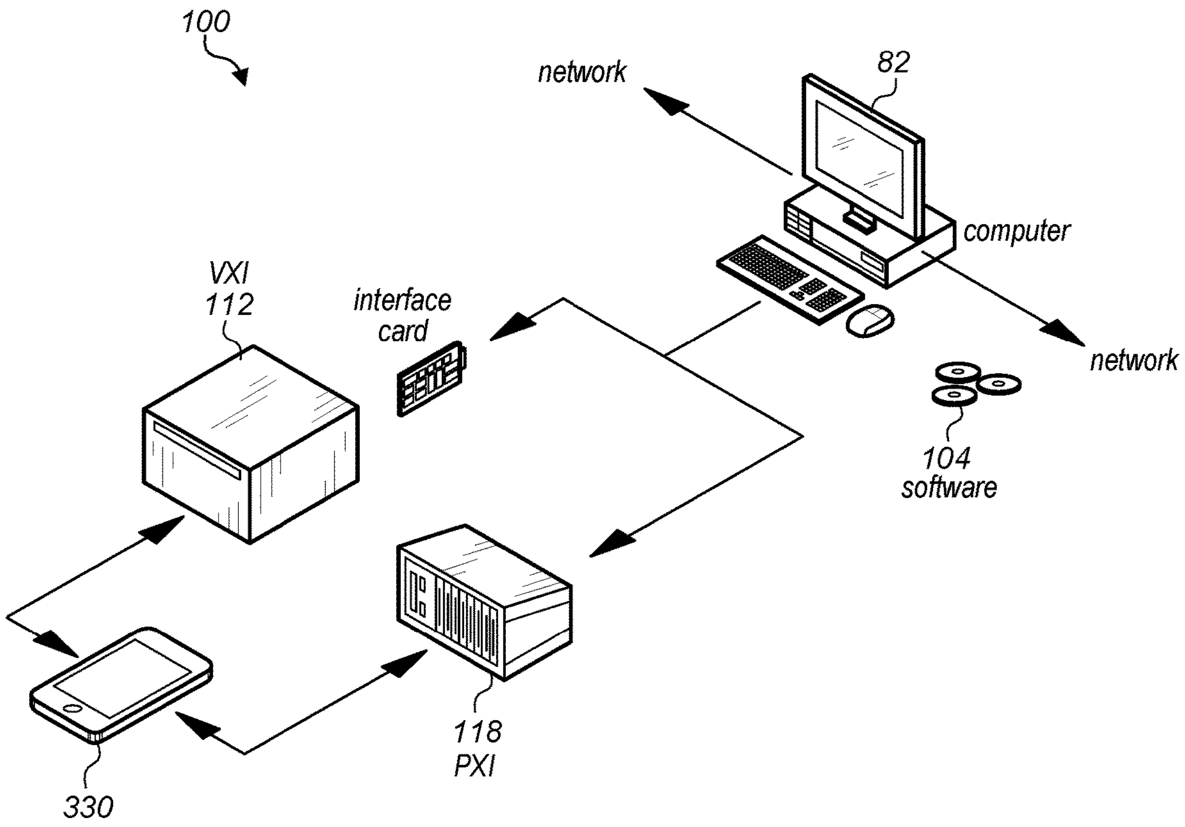
FIG. 2 is a schematic diagram showing a typical measurement setup, according to some embodiments.

FIG. 2—Exemplary Measurement System

FIG. 2 illustrates an exemplary measurement system that is configured to employ embodiments presented herein. A computer 82 may be used by a user to conduct the delay measurement process, and may be connected to a network and to the measurement apparatus. Software 104 may be installed on the computer to conduct the delay measurement process. The computer 82 may be connected to any of a variety of signal generating apparatuses, according to various embodiments. For example, the computer may be connected to a PXI 118 with configurable interface cards. Alternatively or additionally, the computer may be connected to a VXI 112 that is configured with interface cards. The PXI 118 and/or the VXI 112 may serve as waveform generators to supply a signal to the Device Under Test (DUT) 330. The VXI and/or PXI may further function as a vector signal analyzer (VSA), to receive and analyze an output signal from the DUT. The DUT may be any of a variety of electronic devices for which a measurement function is desirable. It should be noted that a DUT may be any of various types of computer systems devices which are mobile or portable and which performs wireless communications, such as mobile wireless devices. Examples of DUTs include mobile telephones (e.g., cellular telephones ("cell phones") or smart phones, portable gaming devices, laptops, tablets, PDAs, portable Internet devices, music players, data storage devices, or other handheld devices, etc. In general, the term "UE" or "UE device" can be broadly defined to encompass any electronic, computing, and/or telecommunications device (or combination of devices) which is easily transported by a user and capable of wireless communication.

In some embodiments, the signal generator and/or signal analyzer may be comprised within the computer 82, which may be directly connected to the DUT 330. A soft front panel, according to embodiments described herein, may be configured to display on a display device of the computer 82 (e.g., on a monitor or other display device).

In some embodiments, separate devices may be used to perform some of the functions (e.g. the AWG, VSG, VSA, etc.) described above. These dedicated devices, which may be known in the art as "box" type instruments, may also be connected to a computer system. In some embodiments, the connected computer system may be configured to receive outputs from or provide inputs to the dedicated instruments. The connected computer system may also, in some embodiments, collect and store data or display outputs from the devices.

In one embodiment, the system may include a memory, e.g., a non-transitory computer accessible memory medium, coupled to one or more processors, where the memory stores program instructions which may be executable by the one or more processors to implement embodiments of the testing method disclosed herein. For example, in one embodiment, the program instructions may be executable to provide a test sequence. The test sequence may include an acquisition sequence and a processing sequence. The acquisition sequence may include a sequence of acquisition functions for performing acquisitions on one or more DUTs, such as UE devices 514*a*-514*d*. The processing sequence may include a sequence of processing functions for processing measurement data resulting from the acquisitions.

In one embodiment, at least one processing function of the processing sequence may be performed concurrently with at least one acquisition function of the acquisition sequence. It should be noted that, as defined above, concurrently means that at least a portion of the (concurrent) processes overlap in time. Alternatively, in one embodiment the execution of the acquisition sequence and the processing sequence may be completely separate (temporally), where the acquisition sequence may be completed prior to any processing function being performed.

Matching an Instrument to a DUT for a Test Procedure

During device development, testing, and design procedures, it may be desirable to test a plurality of functionalities of a DUT. For a particular testing procedure, various types of instruments may be well-suited or not for performing the testing procedure on a particular DUT, depending on the specific properties of the instrument, the testing procedure, and the DUT. As used herein, the term "instrument" is used to refer to any of a variety of types of devices, such as a measurement device or a tester device, that is configured to interface with a DUT as part of a testing procedure. A testing procedure may involve a sequence of actions that may or may not need to be performed in a particular order. This process may be further complicated when a large number of different testing procedures are to be performed on a plurality of different types of DUTs, and/or when a plurality of different instruments is available to potentially perform the different testing procedures. To address these and other concerns, embodiments herein describe methods and devices to match an instrument to a DUT for performing a particular testing procedure.

In some embodiments, a computing device constructs a first data structure to quantify characteristics of an instrument, a second data structure to quantify characteristics of a plurality of testing procedures (referred to herein as a test methodology), and a third data structure (referred to herein as a test case) to quantify characteristics of a specific testing procedure to be performed on a particular DUT. A matching procedure may then be performed between the first and third data structures, to determine if the instrument is a full match, a partial match or a mismatch for performing the testing procedure on the DUT.

Figure 3:
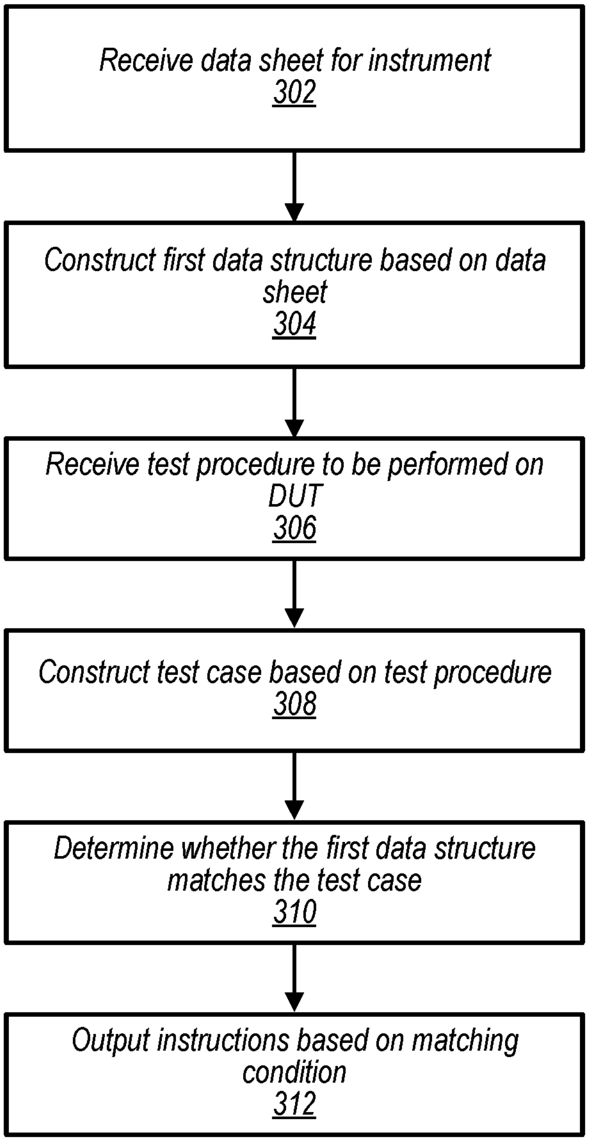
FIG. 3 is a flowchart diagram illustrating a method for determining compatibility between a device-under-test (DUT) and an instrument, according to some embodiments.

FIG. 3: Flowchart of a Method for Testing DUTs

FIG. 3 is a flowchart diagram illustrating a method for determining compatibility between a device-under-test (DUT) and an instrument, according to some embodiments. The method shown in FIG. 3 may be used in conjunction with any of the computer systems or devices shown in the above Figures, among other devices. For example, a processing element of a computer device may store program instructions that, when executed, cause the computer device to perform the recited method steps of receiving and processing information and outputting instructions, as described below. In various embodiments, some of the method elements shown may be performed concurrently, in a different order than shown, or may be omitted. Additional method elements may also be performed as desired. As shown, this method may operate as follows.

At 302, a data sheet for an instrument is received. The data sheet may specify one or more first attributes of the instrument. The attributes of the instrument may include various physical and/or functional aspects of the instrument, and may generally be defined as properties and/or capabilities of the instrument. Examples of attributes may include a number, size, and/or configuration of various types of ports and/or channels on the instrument; input and/or output parameters, values, ranges, and/or impedances; maximum sampling rates; and maximum working voltages, among other possibilities. An example of a data sheet is shown in FIG. 5.

At 304, a first data structure is constructed based on the first data sheet. A respective property name and a respective property value may be extracted from each of the one or more first attributes, and the one or more property names and values may be stored in the first data structure. Natural language processing may be utilized to extract the property names and property values of the first attributes. For example, a property name of "number of channels" and a property value of "10" may be extracted from a data sheet for an instrument with an attribute of 10 channels. As a second example, a property name of "chuck diameter" and a property value of "200 mm" may be extracted from a data sheet for an instrument with an attribute of a 200 mm chuck diameter.

The first data structure may further include one or more first phenomena and one or more first testing interactions associated with respective ones of the one or more first phenomena. Each set of paired phenomena and testing interactions make up an "interaction set". As used herein, the term "phenomenon" refers to any of a variety of physical quantities that may be measured or tested by an instrument. For example, the first phenomena may include one or more of light, voltage, power, intensity, current, resistance, impedance or capacitance, among other possibilities. The phenomena and testing interactions of the first data structure may be determined based on the attributes of the data sheet.

Phenomena may each include a respective phenomenon name and a respective phenomenon value. For example, the phenomenon name may be "voltage" and the phenomenon value may be "50 V", or the phenomenon name may be "light intensity" and the phenomenon value may be "34 lumens", among other possibilities.

As used herein, "testing interaction" refers to any action or procedure that occurs between the DUT and a testing device to measure a respective phenomenon. Testing interactions and phenomena are paired in "interaction sets," and a single interaction set includes a single phenomenon associated with one or more testing interactions. For example, the first testing interaction may include an interaction between the instrument and the DUT to measure the associated first phenomena. For example, a testing interaction may include an application of voltage by a testing device on a DUT or a signal provided by the testing device to cause the DUT to emit sound or light, etc.

The testing interactions may each include at least one respective interaction name and at least one respective interaction value. For example, when the testing interaction is an application of 13 volts (V) of direct current (DC) voltage, the interaction name may b e "DC voltage" and the interaction value may be 13V. To clarify, "phenomenon" refers to the physical quantity of the DUT that is to be measured or tested, whereas "testing interaction" refers to the process performed by the instrument to measure the phenomenon. As one example, it may be desired to measure an intensity of 34 lumens of light emitted by a DUT. To perform this measurement, the instrument may apply a voltage of 5V to the DUT to cause the DUT to emit the desired intensity of light. In this example, the parameters of the interaction set of the first data structure may be allocated as (phenomenon name)=light intensity, (phenomenon value) =34 lumens, (interaction name)=voltage, and (interaction value)=5V.

As a second example, it may be desired to measure a 200 V DC voltage across two terminals of the DUT. To accomplish this measurement, a DC current of 5 Amps (A) may be applied to the DUT by the instrument for a duration of 50 seconds to produce the 200V. In this example, the parameters of the first data structure may be allocated as (phenomenon name)=DC voltage, (phenomenon value)=200 V, (interaction name 1)=measurement time, (interaction value 1)=50 seconds, (interaction name 2)=DC current, and (interaction value 2)=5 A.

For a particular instrument, the first data structure may be constructed to include a set of attributes and interaction sets of the instrument, where each attribute includes a property name and a property value, and each interaction set includes paired phenomena and testing interactions (each of which contain respective names and values).

In some embodiments, a second data structure comprising a test methodology is constructed based on one or more testing procedures. For example, the memory medium may have stored thereon a database of testing procedures that may be performed on one or more types of DUTs (e.g., various types of voltage, luminosity, or other types of measurements). In contrast to the test case described below, the test methodology extracts the phenomena and testing interaction names but not the specific phenomena and testing interaction values for each particular test procedure. In other words, the test methodology contains generic information related to the testing procedures that does not specify the specific quantitative parameters of the one or more test procedures (e.g., while a test case may specify a testing interaction name of "apply voltage" and a testing interaction value of "5V", an analogous test methodology would only specify "apply voltage"). For each of the one or more testing procedures, the test methodology may specify at least one phenomena name and one or more testing interaction names associated with each phenomenon. For example, a testing procedure to measure DC voltage may include the phenomenon of "DV voltage" and the testing interaction of "apply DC current" for its entry in the test methodology. The test methodology may contain generic information related to the one or more testing procedures that is not specific to a particular testing procedure, DUT or tester device/instrument.

At 306, a first test procedure to be performed on a DUT is received. The first test procedure may include specifications for one or more measurements that are to be performed on the DUT, such as a precision, duration, or other property of the measurement(s). As one example, the test procedure may specify to measure a voltage of 20V of the DUT for a duration of 5 seconds, and this information may be extracted into the test case, as described in greater detail below.

The first test procedure may further specify one or more second attributes of the DUT. A respective property name and a respective property value of the DUT may be extracted from each of the one or more second attributes. Natural language processing may be utilized to extract the property names and property values of the second attributes.

At 308, a test case is constructed based on the first test procedure. As one example, the DUT may be a toy and the test procedure may specify that the DUT is to withstand a shock of 19.5V for 4.4 seconds. Based on this test procedure, a test case may be constructed to apply 20V DC for 5 seconds, and subsequently measure current in the DUT.

In at least some embodiments, the test case may be constructed through consultation with the second data structure. For example, the test methodology of the second data structure may be analyzed to find an entry that corresponds to the first test procedure (e.g., in the example above where the test procedure specifies to measure a voltage of 20V for a duration of 5 seconds, an entry may be identified in the test methodology that specifies measuring voltage for an arbitrary duration of time). When a matching entry for the received test procedure is identified in the test methodology, the test case may be constructed by adding specific value information from the test procedure to the matching entry. To reuse the example above, the test case may be constructed by extracting the matching entry in the test methodology and adding a value of 20V for the phenomenon value and a value of 5 seconds for the interaction value.

In other embodiments, the test case may be constructed without reference to the test methodology (e.g., if a matching entry is not identified or a test methodology is not present, in some embodiments). In these embodiments, the test case may be constructed directly from the received test procedure.

In some embodiments, the test case may further include the extracted attributes (i.e., the property names and property values) of the test procedure. Attributes of the test case may be designated in a similar manner as for the first data structure The test case may further include one or more second phenomena and one or more second testing interactions associated with respective ones of the one or more second phenomena. The second phenomena may each include a respective phenomenon name and a respective phenomenon value, and the second testing interactions each include at least one respective interaction name and at least one respective interaction value.

Phenomena and testing interactions of the test case may be designated in a similar manner as for the first data structure. For example, each test procedure may have a phenomenon name and value (e.g., voltage and 20V) specified in a test case, as well as one or more interaction name and value pairs for measuring the phenomenon (e.g., {applying current, 5 A}, {duration of applied current, 50 seconds}, etc.). In some embodiments, the phenomena and/or testing interactions of the first data structure may specify a range of values (i.e., a testing interaction name of "apply voltage" may have a corresponding testing interaction value of "100-300V" that specifies the range of applicable voltages of the instrument), while the test case may specify the specific values of the received test procedure (i.e., "apply voltage" at "120V"). In these embodiments, the matching procedure described below may determine a match when the specific value(s) of the test case lie within the range(s) specified by the first data structure.

At 310, it is determined whether the first data structure matches the test case. To determine whether the first data structure and the test case match, the computing device may perform a hierarchical comparison algorithm wherein the attributes are compared first, followed by the phenomena (if the attributes match), followed by the testing interactions (if the phenomena match). For example, it may be first determined whether the plurality of first attributes of the instrument is compatible with the plurality of second attributes of the test case. For example, it may be determined whether the chuck diameter of the instrument is compatible with an input diameter of the DUT.

Based on a determination that the plurality of first attributes is compatible with the plurality of second attributes, it may be determined whether the one or more second phenomena of the instrument match to the one or more first phenomena of the test case. For example, if the test case contains an interaction set for a voltage measurement, it may be determined whether the first data structure for the instrument contains an interaction set for a voltage measurement.

Based on a determination that the one or more second phenomena match to the one or more first phenomena, a matching condition is determined between the one or more first testing interactions of the first data structure and the one or more second testing interactions of the test case. The matching condition may indicate a full match, a partial match or a mismatch. For example, if a range of voltage measurements of the instrument (e.g., 0-200V) partially overlaps with a range of voltage to be measured as indicated by the testing methodology (e.g., 100-1000V), a partial match may be indicated. Alternatively, if the range of voltage measurements of the instrument (e.g., 0-200V) completely covers the range of voltage to be measured as indicated by the testing methodology (e.g., 100-200V), a full match may be indicated. As yet another possibility, if the two ranges of voltages are disjoint (e.g., 0-200V and 300-400V), a mismatch may be indicated.

At 312, the computing device output instructions based on the matching condition. When the matching condition indicates a full match, instructions may be output to utilize the instrument to perform the testing procedure on the DUT. Alternatively, when the matching condition indicates a partial match, the computer system may specify one or more incompatibilities between the instrument and the testing procedure and/or provide a recommendation to upgrade the testing device (e.g., to obtain a closer partial match or a full match).

Additional Description

The following numbered paragraphs provide additional description of embodiments of the invention.

Figure 4:
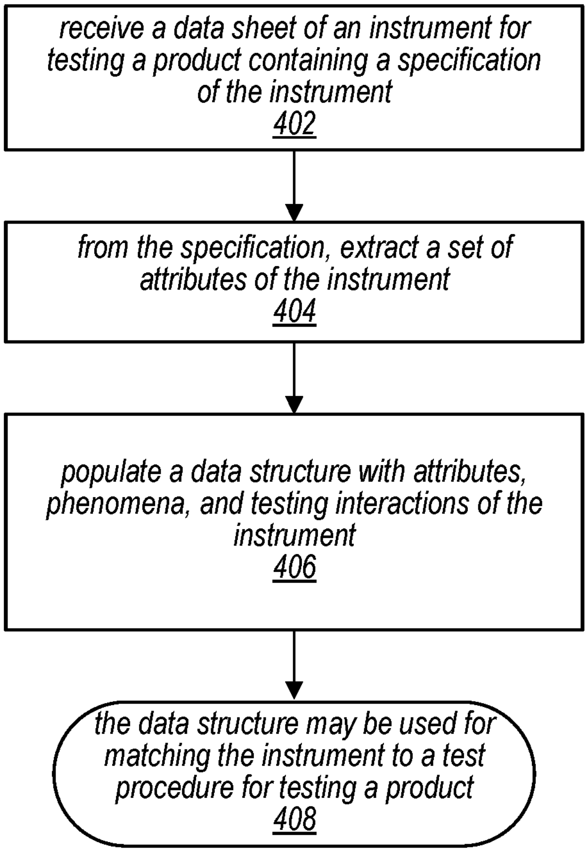
FIG. 4 is a flowchart diagram illustrating a method for populating a data structure for a DUT based on a data sheet, according to some embodiments.

FIG. 4 is a flowchart diagram illustrating a method for populating a data structure based on a data sheet of a DUT, according to some embodiments. The method steps described in reference to FIG. 4 provide further detail related to methods described in FIG. 3 and in particular steps 302-304 of FIG. 3 related to construction of the first data structure.

As illustrated, at 402 a data sheet of DUT is received that contains specifications for the DUT. As one specific example, a user may receive a CDAQ 9205 instrument and an accompanying physical datasheet. An example of a data sheet is shown in FIG. 5.

At 404, a set of attributes of the DUT is extracted from the data sheet. The CDAQ 9205 instrument can measure voltage, and attributes of the DUT may be extracted, such as the voltage range it can measure and how the accuracy of the voltage measurement is calculated depending on the voltage range. Natural language processing may be used to extract the attributes, in some embodiments.

At 406, a data structure is populated with attributes, phenomena and testing interactions based on the data sheet. For example, the user may create an entry in the database for the instrument. The instrument can measure the phenomenon "voltage" using the testing interaction "measure voltage", and the user creates a reference to the phenomenon and testing interaction in the instrument entry in the database. The user may set the "voltage range" interaction value of the testing interaction to 0-10V.

Figure 6:
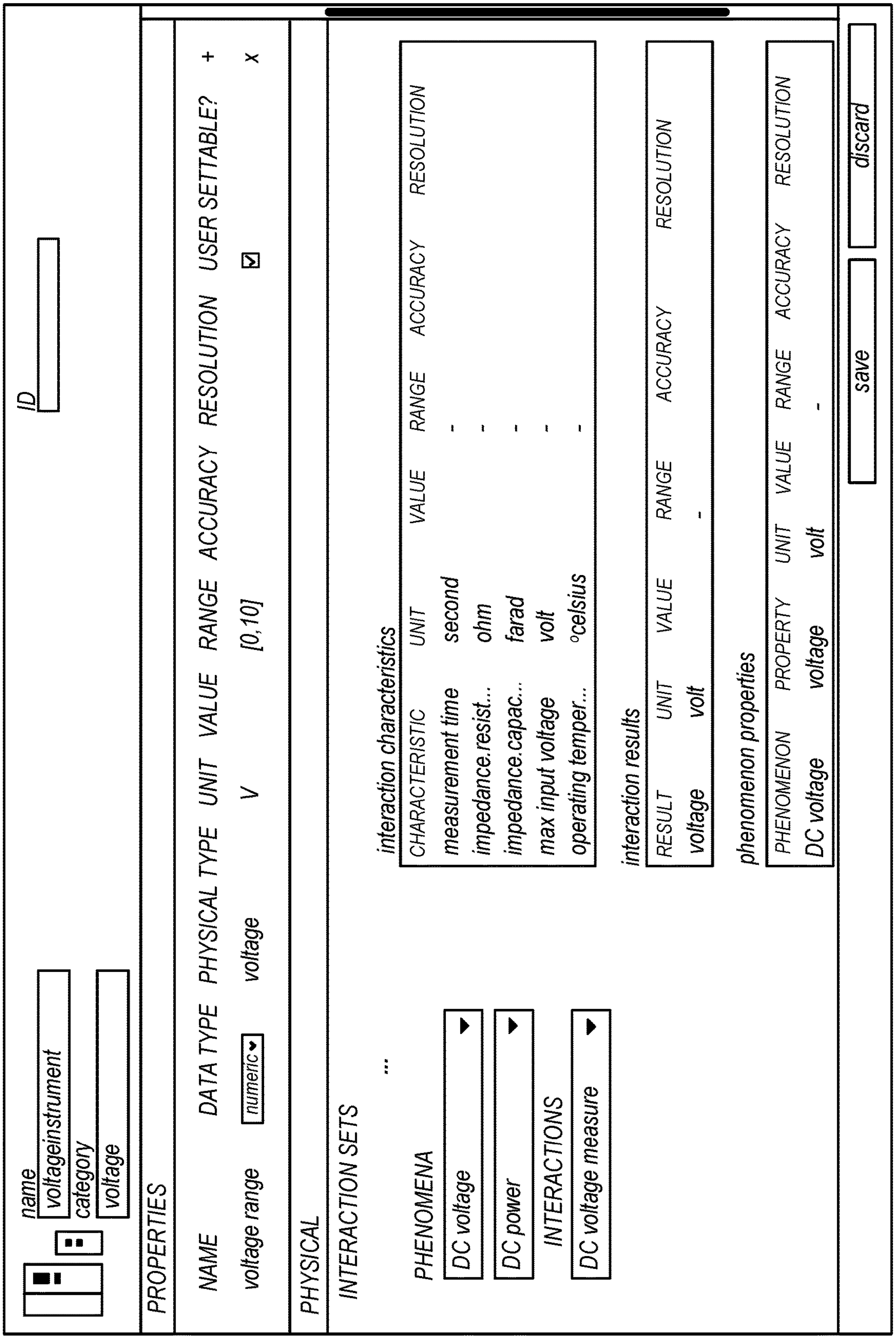
FIG. 6 illustrates a graphical user interface (GUI) for entering properties of an instrument, according to some embodiments.

FIG. 6 is an illustration of an example graphical user interface (GUI) that may be utilized by a user to enter properties of a DUT. For example, in the testing interaction entry the user may enter a formula for the calculation of the accuracy depending on the voltage range, e.g., accuracy="temperature gain offset" *"voltage range"/10.

At 408, the data structure may be used for a matching procedure between the DUT and a test procedure, e.g., as described in reference to FIG. 3.

Figure 7:
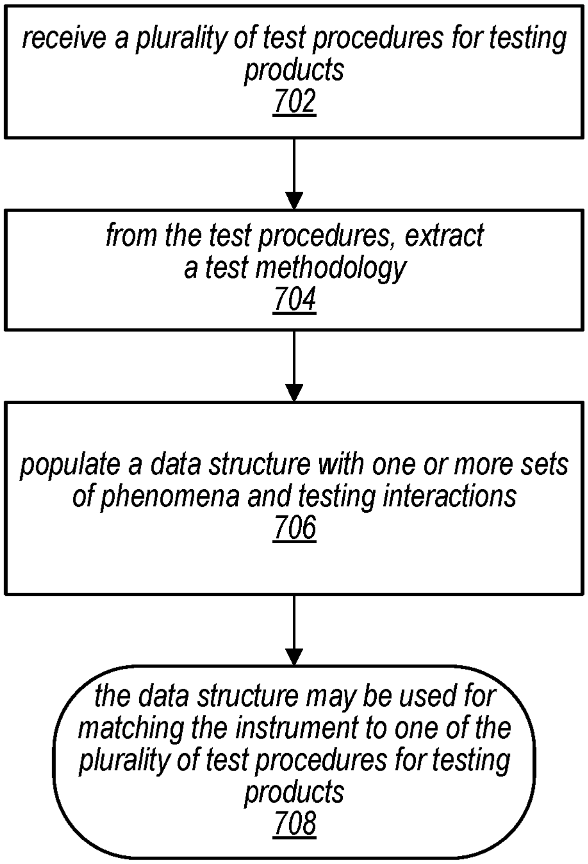
FIG. 7 is a flowchart diagram illustrating a method for populating a data structure based on a plurality of test procedures, according to some embodiments.

FIG. 7 is a flowchart diagram illustrating a method for populating a data structure based on a plurality of test procedures, according to some embodiments. The method steps described in reference to FIG. 7 provide further detail related to methods described in FIG. 3.

At 702, a plurality of test procedures for testing products is received. For example, a user may receive a new test procedure via email or another medium, which may be added to an existing database of test procedures. The test procedures may each include a set of English language steps for testing electric motors, as one example.

At 704, a test methodology may be extracted from the plurality of test procedures. For example, the user may extract from a test procedure that a voltage should be measured.

At 706, a data structure is populated with one or more sets of phenomena and associated testing interactions based on the test methodology. For example, the user may create a data structure for the test methodology. The user then finds the voltage measurement interaction by name in the database and it gets referenced in the test methodology. The testing interaction in turn identifies a phenomenon named voltage and the voltage phenomenon gets referenced (e.g. linked) in the test methodology also. The test methodology may be stored as a sequence of phenomena and associated testing interactions. For example, a test of a motor may include 1) checking for voltage overload by 1a) applying a voltage to pin 1, 1b) measuring an output voltage on pin 2, and 1a) verifying that the voltage does not exceed a specified safety limit. At 708, the data structure may be used for matching the instrument to one of the plurality of test procedures for testing products.

Figure 8:
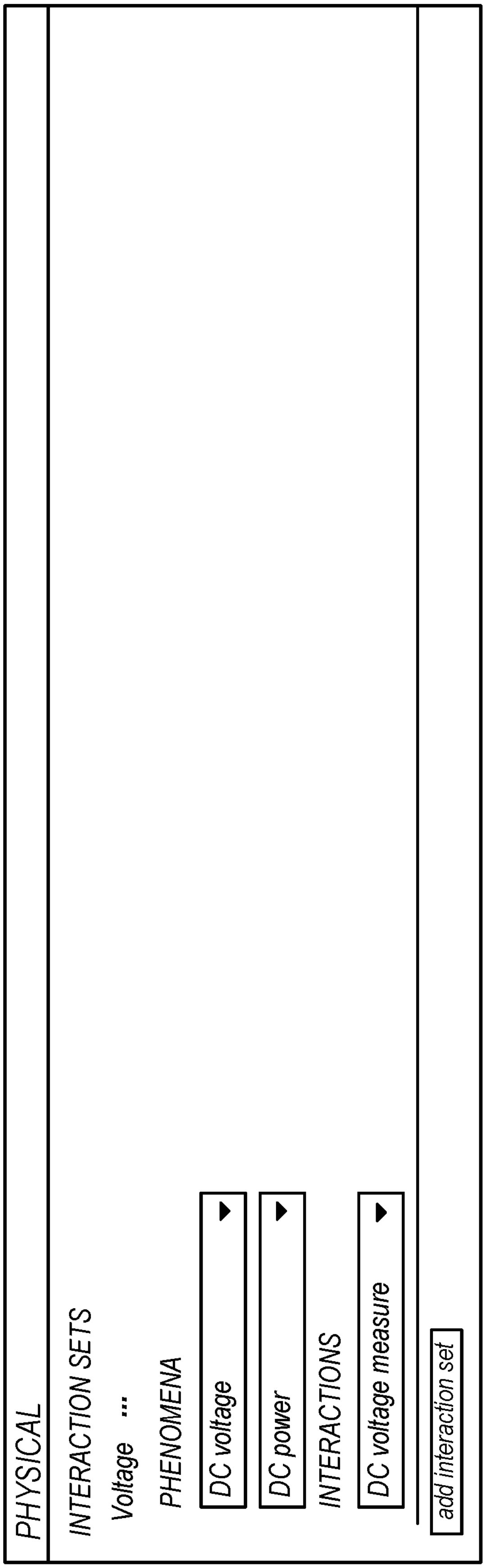
FIG. 8 illustrates a GUI for entering phenomena and interactions of a test procedure, according to some embodiments.

FIG. 8 illustrates a GUI for entering phenomena and interactions of a test procedure into a data structure, according to some embodiments. The user may find the voltage phenomenon by name in the database which may be referenced in the test methodology. The phenomenon in turn identifies a testing interaction named voltage measurement and the voltage measurement interaction may be referenced (e.g. linked) in the test methodology also.

Figure 9:
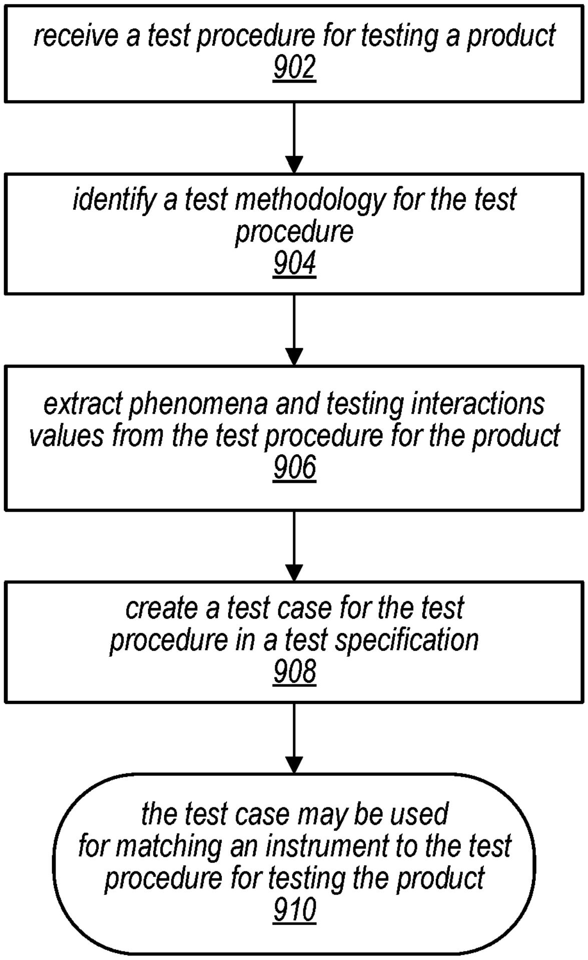
FIG. 9 is a flowchart diagram illustrating a method for populating a data structure based on a test procedure, according to some embodiments.

FIG. 9 is a flowchart diagram illustrating a method for populating a data structure based on a specific test procedure to be performed on a DUT, according to some embodiments. The method steps described in reference to FIG. 9 provide further detail related to methods described in FIG. 3 and in particular steps 306-308 of FIG. 3 related to determining a test case.

At 902, a user receives a test procedure for testing a DUT. For example, a test procedure may be received to test a power supply in a plastic toy.

At 904, a test methodology is identified for the test procedure. For example, the test procedure may have instructions to verify that the power supply produces transient voltage above 500 mV for longer than 3 mS. The user identifies that this may be satisfied by measuring voltage in the range 100-1000 mV with a time resolution of 1 mS. The user may browse through a list of test methodologies previously created, and may identify ones that may be used to measure transient voltage according to the desired specifications, and an appropriate test methodology may be chosen.

At 906, phenomena and testing interactions may be extracted from the test procedure.

At 908, a test case is created by referencing the test methodology found and setting the voltage range of the voltage measurement interaction that is referenced by the test methodology to 100-1000 mV and the time resolution to 1 mS in the data structure representing the test case. At 910, the test case may be used for matching an instrument to the test procedure for testing the product.

Figure 10:
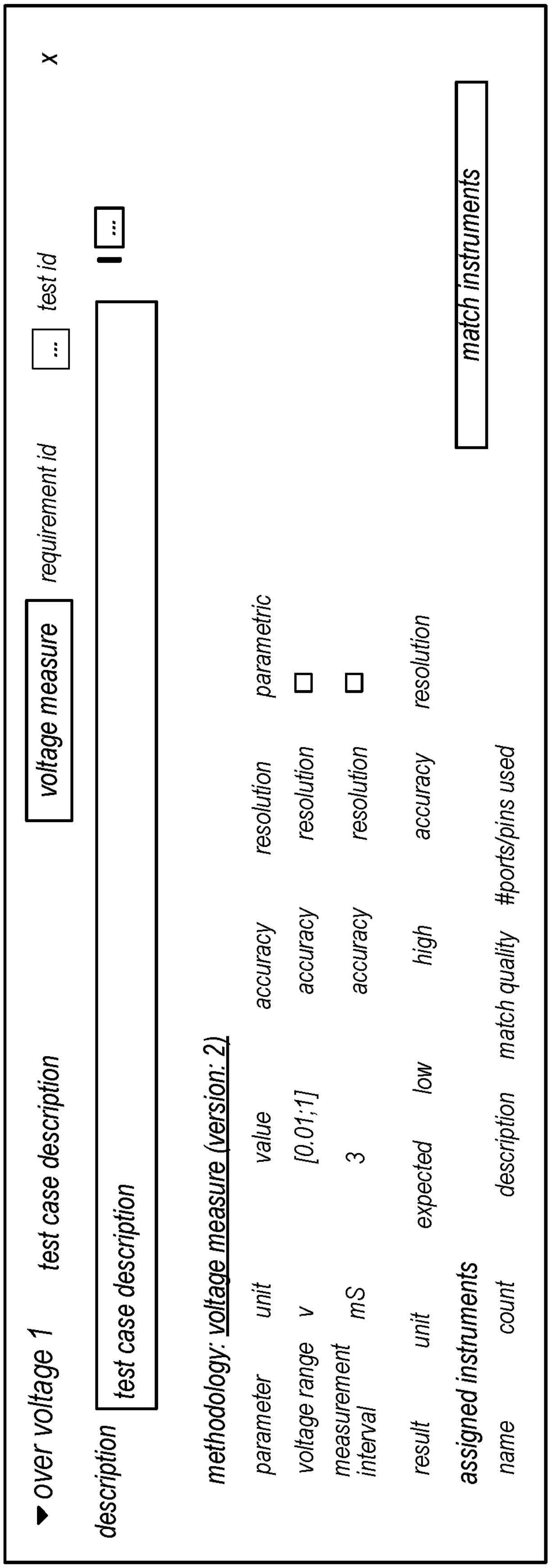
FIG. 10 illustrates a GUI exhibiting specifications of a test procedure, according to some embodiments.

FIG. 10 illustrates a GUI exhibiting specifications of a test procedure, according to some embodiments.

Figure 11:
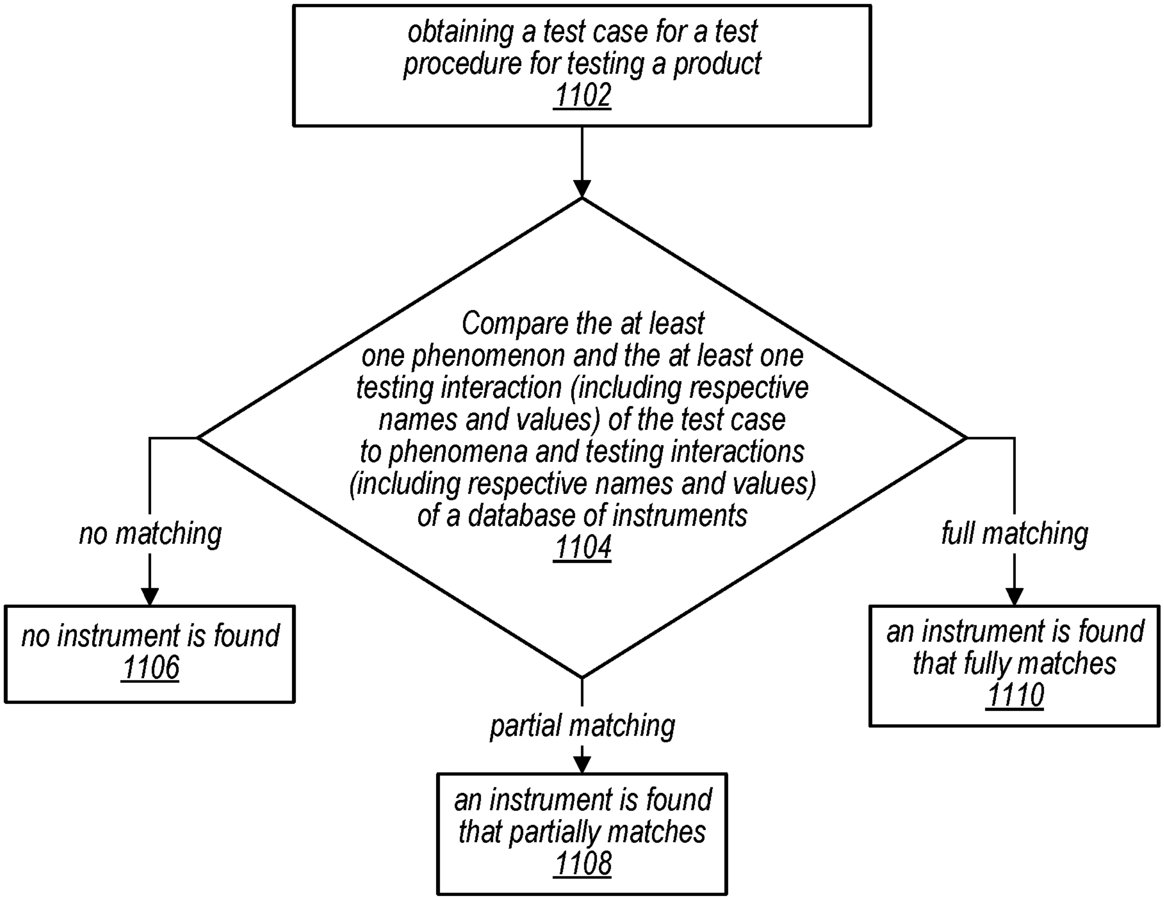
FIG. 11 is a flowchart diagram illustrating a method for performing a matching procedure between a DUT and a testing procedure, according to some embodiments.

FIG. 11 is a flowchart diagram illustrating a method for performing a matching procedure between a DUT and a testing procedure, according to some embodiments. The method steps described in reference to FIG. 11 provide further detail related to methods described in FIG. 3 and in particular steps 310-312 of FIG. 3 related to determining a matching condition between a DUT and a test procedure.

At 1102, a test case is obtained for a test procedure. For example, a user may create a test case for testing the power supply of a small toy. The user may be interested in knowing if there are any test instruments that can make the measurement specified by the test case (e.g., voltage in the range 100-1000 mV, time resolution 1 mS).

At 1104, a comparison is made between at least one phenomenon and at least one testing interaction (and the phenomenon value and the interaction value) of the test case, and phenomena and a testing interactions (and a phenomenon value and an interaction value) of a database of instruments. The measurement may be listed in the test case in terms of the testing interaction (e.g. transient voltage measurement) and the phenomenon (e.g. transient voltage), which may be compared against the testing interaction and phenomenon of each instrument found in the database.

At 1106, if the phenomenon (e.g. transient voltage) is not found, then there is no match. If the phenomenon (e.g. transient voltage) is found but the testing interaction (e.g. transient voltage measure) is not found there is no match. If no match is found, then the system may recommend an instrument to purchase or an available upgrade for an instrument in the database. Also, the system may recommend a transducer to convert the phenomenon to something the user has an instrument for. The system may also recommend matches from instruments that measure similar phenomenon, e.g. current and voltage or force and pressure. From information about what does not match a system may propose new instruments to build.

At 1110, if a phenomenon (e.g. transient voltage) is found and an interaction (e.g. transient voltage measure) is found and the range and the time resolution also match there is a full match. The system may present a list of instruments that have a full match and rank them by secondary measures such as cost, size, vendor, compatibility with other instruments.

If there are several test cases that match to the same instrument the system may tell the user how many instruments they will need. It may also tell the user if the instrument does not have the capacity to perform all the test cases and multiple instruments may be desired to successfully perform the test procedure. It may also tell the user how many test cases an instrument can cover.

If long term information about repeated matches occurs then the system may propose new instruments with greater capability.

At 1108, if a phenomenon (e.g. transient voltage) is found and an interaction is found (e.g. transient voltage measure) and the ranges are not compatible there is a partial match. In the case of a partial match the information about the incompatibility is reported to the user and based on this information the user may change the requirements or change the instrument properties to see if they can improve the match.

For example, if the range is [100:1000] and the instrument can measure [0:200] then the ranges are not entirely compatible. The system may suggest that the user change a setting to increase the range the instrument can measure, e.g., to [0-1000]. Alternatively, the system may suggest that the user change the testing parameter to be [100:200].

The calibration information of an instrument may be used to update properties of the instrument in the system to provide a more accurate answer to the question of whether that instrument may be best utilized to perform the measurement. The system may track updates to the instrument information and inform the user if the instrument can no longer perform the measurement.

Figure 12:
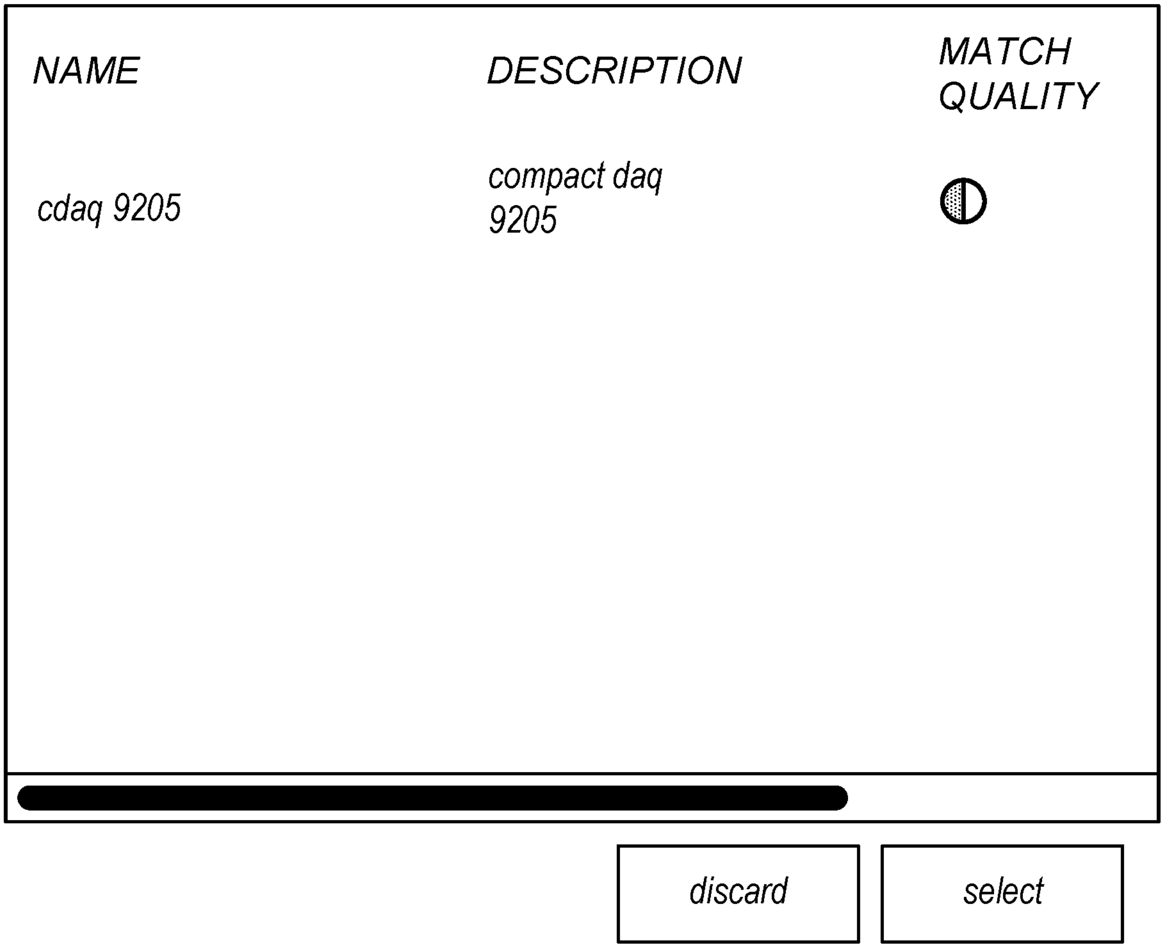
FIG. 12 illustrates an example of a matching result, according to some embodiments.

FIG. 12 illustrates an example of a matching result, according to some embodiments. FIG. 12 illustrates a partial match quality for a compact DAQ 9205.

Embodiments of the present disclosure may be realized in any of various forms. For example, in some embodiments, the disclosed techniques may be realized as a computer-implemented method, a computer-readable memory medium, or a computer system. In other embodiments, the disclosed techniques may be realized using one or more custom-designed hardware devices such as ASICs. In other embodiments, the he disclosed techniques may be realized using one or more programmable hardware elements such as FPGAs.

In some embodiments, a non-transitory computer-readable memory medium may be configured so that it stores program instructions and/or data, where the program instructions, if executed by a computer system, cause the computer system to perform a method, e.g., any of the method embodiments described herein, or, any combination of the method embodiments described herein, or, any subset of any of the method embodiments described herein, or, any combination of such subsets.

In some embodiments, a computing device may be configured to include a processor (or a set of processors) and a memory medium, where the memory medium stores program instructions, where the processor is configured to read and execute the program instructions from the memory medium, where the program instructions are executable to implement any of the various method embodiments described herein (or, any combination of the method embodiments described herein, or, any subset of any of the method embodiments described herein, or, any combination of such subsets). The device may be realized in any of various forms. For example, the computer system may be a personal computer (in any of its various realizations), a workstation, a computer on a card, an application-specific computer in a box, a server computer, a client computer, a hand-held device, a mobile computing device, a tablet computer, a wearable computer, etc.

In some embodiments, a set of computers distributed across a network may be configured to partition the effort of executing a computational method (e.g., any of the method embodiments disclosed herein).

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The invention claimed is:

1. A non-transitory computer-readable memory medium storing program instructions which, when executed by a processor, are configured to cause a computing device to:

receive a data sheet specifying a plurality of first attributes of an instrument, wherein the plurality of first attributes comprise physical properties or functional capabilities of the instrument;

construct a first data structure based on the data sheet, wherein the first data structure comprises one or more first phenomena and one or more first testing interactions associated with respective ones of the one or more first phenomena, wherein the one or more first phenomena comprise one or more physical quantities that are measurable or testable by the instrument;

receive a first test procedure to be performed on a device-under-test (DUT), wherein the first test procedure specifies a plurality of second attributes of the DUT and one or more measurements specifications to be performed on the DUT, wherein the plurality of second attributes comprise physical properties or functional capabilities of the DUT;

construct a test case based on the first test procedure, wherein the test case comprises one or more second phenomena and one or more second testing interactions associated with respective ones of the one or more second phenomena, wherein the one or more second phenomena comprise one or more measurable or testable physical quantities of the DUT;

determine whether the plurality of first attributes is compatible with the plurality of second attributes;

based on a determination that the plurality of first attributes is compatible with the plurality of second attributes, determine whether the one or more second phenomena match to the one or more first phenomena;

based on a determination that the one or more second phenomena match to the one or more first phenomena:

determine a matching condition between the one or more first testing interactions and the one or more second testing interactions; and based on a determination that the matching condition comprises a full match, output instructions comprising an indication to utilize the instrument to perform the testing procedure on the DUT.

2. The non-transitory computer-readable memory medium of claim 1, wherein the first and second phenomena each comprise a respective phenomenon name and a respective phenomenon value, and wherein the first and second testing interactions each comprise at least one respective interaction name and at least one respective interaction value.

3. The non-transitory computer-readable memory medium of claim 1, wherein the first and second phenomena comprise one or more of voltage, power, intensity, current, resistance, impedance or capacitance.

4. The non-transitory computer-readable memory medium of claim 1, wherein the first and second testing interactions comprise one or more interactions between the instrument and the DUT to measure the associated first or second phenomena.

5. The non-transitory computer-readable memory medium of claim 1, wherein the program instructions are further executable to cause the computing device to:

based on a determination that the matching condition comprises a partial match, output second instructions comprising an indication to upgrade the instrument.

6. The non-transitory computer-readable memory medium of claim 1, wherein the program instructions are further executable to cause the computing device to:

based on a determination that the matching condition comprises a partial match, output second instructions specifying one or more incompatibilities between the instrument and the testing procedure.

7. The non-transitory computer-readable memory medium of claim 1, wherein the program instructions are further executable to cause the computing device to:

construct a second data structure based on one or more testing procedures, wherein, for each of the one or more testing procedures, the second data structure comprises one or more respective third phenomenon names and one or more respective third testing interaction names associated with respective ones of the one or more third phenomenon names, wherein the second data structure does not comprise phenomenon values associated with the third phenomenon names or testing interaction values associated with the third testing interaction names, wherein the test case is determined based at least in part on the second data structure.

8. The non-transitory computer-readable memory medium of claim 1, wherein the program instructions are further executable to cause the computing device to:

for each of the first and second attributes, extract a respective property name and a respective property value, wherein the first data structure further comprises one or more property names and property values of the first attributes.

9. The non-transitory computer-readable memory medium of claim 8, wherein natural language processing is utilized to extract the property names and property values of the first and second attributes.

10. A method for matching an instrument to a device-under-test (DUT) for performing a first test procedure, the method comprising:

receiving a data sheet specifying a plurality of first attributes of the instrument, wherein the plurality of first attributes comprise physical properties or functional capabilities of the instrument;

constructing a first data structure based on the data sheet, wherein the first data structure comprises one or more first phenomena and one or more first testing interactions associated with respective ones of the one or more first phenomena, wherein the one or more first phenomena comprise one or more physical quantities that are measurable or testable by the instrument;

receiving the first test procedure to be performed on the DUT, wherein the first test procedure specifies a plurality of second attributes of the DUT and one or more measurements specifications to be performed on the DUT, wherein the plurality of second attributes comprise physical properties or functional capabilities of the DUT;

constructing a test case based on the first test procedure, wherein the test case comprises one or more second phenomena and one or more second testing interactions associated with respective ones of the one or more second phenomena, wherein the one or more second phenomena comprise one or more measurable or testable physical quantities of the DUT;

determining whether the plurality of first attributes is compatible with the plurality of second attributes;

based on a determination that the plurality of first attributes is compatible with the plurality of second attributes, determining whether the one or more second phenomena match to the one or more first phenomena;

based on a determination that the one or more second phenomena match to the one or more first phenomena:

determining a matching condition between the one or more first testing interactions and the one or more second testing interactions; and based on a determination that the matching condition comprises a full match, outputting instructions comprising an indication to utilize the instrument to perform the testing procedure on the DUT.

11. The method of claim 10, wherein the first and second phenomena each comprise a respective phenomenon name and a respective phenomenon value, and wherein the first and second testing interactions each comprise at least one respective interaction name and at least one respective interaction value.

12. The method of claim 10, wherein the first and second phenomena comprise one or more of light, voltage, power, intensity, current, resistance, impedance or capacitance.

13. The method of claim 10, wherein the first and second testing interactions comprise one or more interactions between the instrument and the DUT to measure the associated first or second phenomena.

14. The method of claim 10, the method further comprising:

constructing a second data structure based on one or more testing procedures, wherein, for each of the one or more testing procedures, the second data structure comprises one or more respective third phenomenon names and one or more respective third testing interaction names associated with respective ones of the one or more third phenomenon names, wherein the second data structure does not comprise phenomenon values associated with the third phenomenon names or testing interaction values associated with the third testing interaction names wherein the test case is determined based at least in part on the second data structure.

15. The method of claim 10, the method further comprising:

for each of the first and second attributes, extracting a respective property name and a respective property value, wherein natural language processing is utilized to extract the property names and property values of the first and second attributes, and wherein the first data structure further comprises one or more property names and property values of the first attributes.

* * * * *